(12) United States Patent
Isono et al.

(10) Patent No.: US 11,009,410 B2
(45) Date of Patent: May 18, 2021

(54) PRESSING SENSOR AND ELECTRONIC DEVICE FOR DETECTING THE END OF A PRESS WITHOUT ERROR

(71) Applicant: Murata Manufacturing Co., Ltd., Nagaokakyo (JP)

(72) Inventors: Fumiya Isono, Nagaokakyo (JP); Takashi Kihara, Nagaokakyo (JP); Hideki Kawamura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/594,589

(22) Filed: Oct. 7, 2019

(65) Prior Publication Data
US 2020/0033204 A1    Jan. 30, 2020

Related U.S. Application Data

(63) Continuation of application No. PCT/JP2018/035927, filed on Sep. 27, 2018.

(30) Foreign Application Priority Data

Oct. 3, 2017 (JP) .............................. JP2017-193167

(51) Int. Cl.
*G01L 1/16* (2006.01)
*G06F 3/02* (2006.01)
*G06F 3/041* (2006.01)

(52) U.S. Cl.
CPC .............. *G01L 1/16* (2013.01); *G06F 3/0202* (2013.01); *G06F 3/041* (2013.01)

(58) Field of Classification Search
CPC . G01L 1/146; G01L 1/16; G01L 1/162; G06F 3/02; G06F 3/041; G06F 3/0412;
(Continued)

(56) References Cited

U.S. PATENT DOCUMENTS 8,797,289 B2   8/2014   Nakayama et al.
9,465,439 B2   10/2016  Shinozaki et al.
(Continued)

FOREIGN PATENT DOCUMENTS

JP   2012137897 A   7/2012
JP   2013142907 A   7/2013
(Continued)

OTHER PUBLICATIONS

International Search Report issued for PCT/JP2018/035927, dated Dec. 4, 2018.
(Continued)

*Primary Examiner* — Alexander Eisen
*Assistant Examiner* — Nelson Lam
(74) *Attorney, Agent, or Firm* — Arent Fox LLP

(57) ABSTRACT

A pressing sensor is provided that includes a first sensor element that outputs a voltage corresponding to an amount of displacement in shape of a receiving unit that receives a press operation; a press operation determining unit that determines whether the receiving unit is in a state of receiving a press operation; and a setting unit that, after elapse of a first prescribed time from a point of time at which the press operation determining unit determines that the receiving unit has received a press operation, sets an absolute value of a threshold that is smaller than an absolute value of the threshold before elapse of the first prescribed time, the absolute value of the threshold representing a difference from a ground voltage value for determining whether the receiving unit has ended reception of the press operation.

16 Claims, 8 Drawing Sheets

(58) Field of Classification Search
CPC ........ G06F 3/0414; G06F 3/044; G06F 3/045; G06F 3/046; G06F 3/047
USPC .................................. 345/156–158, 173–179
See application file for complete search history.

(56) References Cited

U.S. PATENT DOCUMENTS

| | | | |
|---|---|---|---|
| 10,352,786 B2* | 7/2019 | Kawamura | H01L 41/1132 |
| 10,474,285 B2 | 11/2019 | Kumada et al. | |
| 10,649,573 B2* | 5/2020 | Kihara | G06F 3/0487 |
| 10,809,857 B2* | 10/2020 | Kihara | G06F 3/0488 |
| 2009/0134966 A1 | 5/2009 | Baker | |
| 2012/0194472 A1* | 8/2012 | DaCosta | G06F 3/0418 |
| | | | 345/174 |
| 2012/0306799 A1 | 12/2012 | Nakayama et al. | |
| 2014/0368455 A1 | 12/2014 | Croisonnier et al. | |
| 2015/0009164 A1 | 1/2015 | Shinozaki et al. | |
| 2015/0268786 A1* | 9/2015 | Kitada | G06F 3/041 |
| | | | 345/173 |
| 2015/0338981 A1* | 11/2015 | Ando | G02F 1/13363 |
| | | | 349/12 |
| 2017/0083693 A1* | 3/2017 | Bengtsson | G06K 9/00892 |
| 2018/0058954 A1* | 3/2018 | Kihara | H01L 41/08 |
| 2018/0059857 A1 | 3/2018 | Kumada et al. | |
| 2018/0062650 A1* | 3/2018 | Hattori | H03K 17/9622 |
| 2018/0314365 A1* | 11/2018 | Kihara | G06F 3/016 |
| 2019/0036528 A1* | 1/2019 | Mori | H03K 17/964 |
| 2019/0227649 A1* | 7/2019 | Micci | G01L 1/16 |

FOREIGN PATENT DOCUMENTS

| | | |
|---|---|---|
| JP | 2017033505 A | 2/2017 |
| JP | 2018036959 A | 3/2018 |
| WO | 2011099361 A1 | 8/2011 |
| WO | 2013105516 A1 | 7/2013 |

OTHER PUBLICATIONS

Written Opinion of the International Searching Authority issued for PCT/JP2018/035927, dated Dec. 4, 2018.

* cited by examiner

PRESSING SENSOR AND ELECTRONIC DEVICE FOR DETECTING THE END OF A PRESS WITHOUT ERROR

CROSS REFERENCE TO RELATED APPLICATIONS

The present application is a continuation of PCT/JP2018/035927 filed Sep. 27, 2018, which claims priority to Japanese Patent Application No. 2017-193167, filed Oct. 3, 2017, the entire contents of each of which are incorporated herein by reference.

TECHNICAL FIELD

The present invention relates to a pressing sensor having a piezoelectric element and to an electronic device having the pressing sensor.

BACKGROUND

Patent Document 1 (identified below) discloses a displacement sensor including an elastic material and a piezoelectric element of a flat film attached to a first main surface of the elastic material. Moreover, the piezoelectric element has electrodes formed respectively on both main surfaces of a piezoelectric sheet. According to the displacement sensor described in Patent Document 1, the piezoelectric sheet is displaced in shape by displacement in shape of the elastic material to cause a piezoelectric effect, by which an output voltage corresponding to the amount of displacement is output from the electrodes formed on both surfaces of the piezoelectric sheet.

FIGS. 11(A) to 11(C) are diagrams for explaining fluctuations of a voltage that is generated when a conventional displacement sensor is subjected to a long press operation. In FIGS. 11(A) to 11(C), sections denoted as S represent times during which the displacement sensor detects a press. According to the displacement sensor described in Patent Document 1, for example, when a user presses the displacement sensor, it generates a positive voltage, and when the positive voltage exceeds a given positive threshold (Vth1), the sensor determines that the press has been started, as indicated in FIG. 11(A). When the user removes the user's hand from the displacement sensor, the sensor then generates a negative voltage, and when the negative voltage drops below a given negative threshold (Vth2), the sensor determines that the press has ended. In the present description, negative and positive polarities will be explained on the assumption that a reference voltage is 0 V. In the present description, a case where the reference voltage is defined as a ground voltage will be described.

Patent Document 1: International Publication No. 2012-137897.

A case where the displacement sensor described in Patent Document 1 is pressed for a long time is considered. In this case, at the start of the press operation to the displacement sensor, a positive voltage is generated and then a negative voltage is also generated as a result of a restitutive action of the elastic material. For this reason, as shown in FIG. 11(B), if the threshold (Vth2) is set as a threshold small in magnitude on the negative side for determining the end of the press, the negative voltage generated as a result of the restitutive action may drop below the threshold (Vth2), which leads to an error in determining the end of the press. In contrast, as shown in FIG. 11(C), if the threshold (Vth2) is set as a threshold large in magnitude on the negative side for determining the end of the press, because fluctuations of output voltages become smaller when the user's hand is removed slowly, the negative voltage resulting from removal of the hand may fail to drop below the threshold (Vth2), in which case the end of the press cannot be detected.

SUMMARY OF THE INVENTION

In view of the foregoing, it is an object of an embodiment of the present invention to provide a pressing sensor that, even when the pressing sensor (e.g., a displacement sensor) is subjected to a long press, can detect the end of the long press without an erroneous operation.

According to an exemplary embodiment, a pressing sensor is provided that includes a first sensor element, a press operation determining unit, and a setting unit. The first sensor element is configured to output a voltage corresponding to an amount of displacement in shape of a receiving unit that receives a press operation. The press operation determining unit is configured to determine whether the receiving unit is in a state of receiving a press operation, based on a threshold. After the elapse of a first prescribed time from a point of time at which the press operation determining unit determines that the receiving unit has received a press operation, the setting unit is configured to set an absolute value of a threshold that is smaller than an absolute value of the threshold before the elapse of the first prescribed time, with the absolute value of the threshold representing a difference from a ground voltage value for determining whether the receiving unit has ended reception of the press operation.

In this configuration, the threshold at a point of time at which the press operation determining unit determines that the receiving unit has ended reception of the press operation is set to be smaller in its difference from the ground voltage than the threshold at the point of time at which the press operation determining unit determines that the receiving unit has received the press operation. Even when the user presses the receiving unit for a long time and then removes the user's finger slowly from the receiving unit, because the absolute value of the threshold is set as a small value, the press operation determining unit is configured to determine that the receiving unit has ended reception of the press operation. Thus, even when the pressing sensor (e.g., a displacement sensor) is subjected to a long press, the end of the long press can be detected without an erroneous operation.

Moreover, an electronic device includes the above pressing sensor according to an exemplary embodiment.

In this configuration, by disposing the pressing sensor on an operating unit or the like of the electronic device, the end of a long press can be detected without an erroneous operation when the operating unit is subjected to the long press.

According to the exemplary embodiment of the present invention, even when the displacement sensor is subjected to a long press, the end of the long press can be detected without an erroneous operation.

DETAILED DESCRIPTION

Figure 1A:
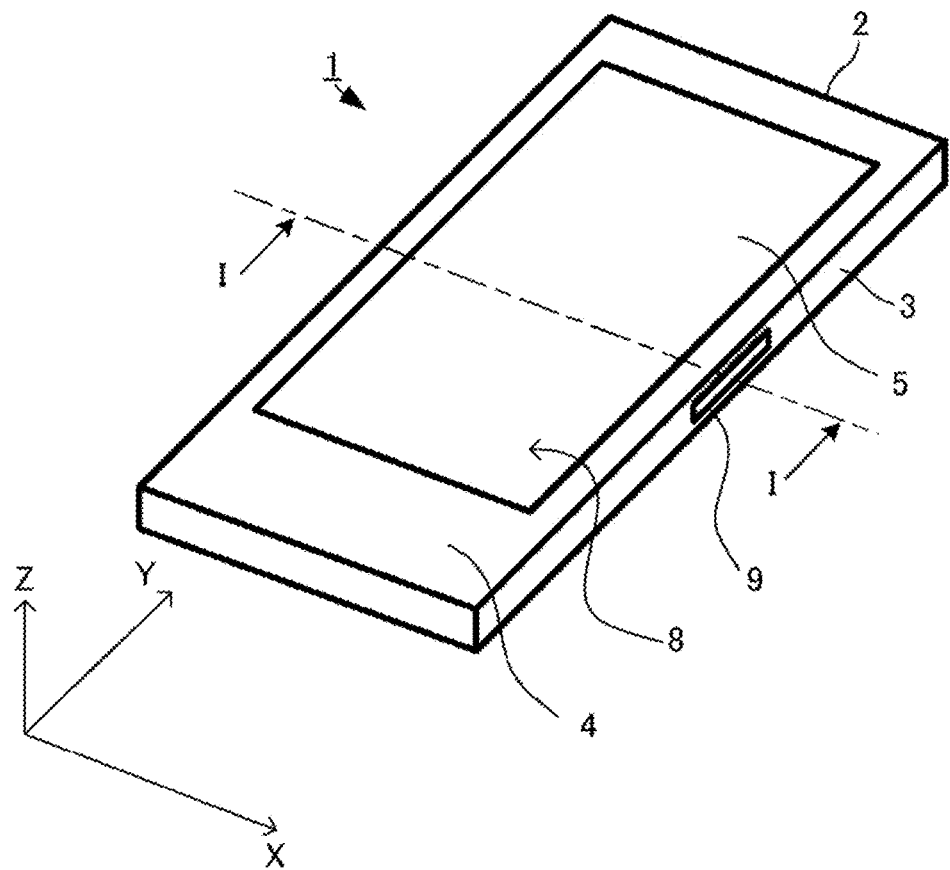
FIG. 1(A) is a perspective view of an electronic device according to a first embodiment.
Figure 1B:
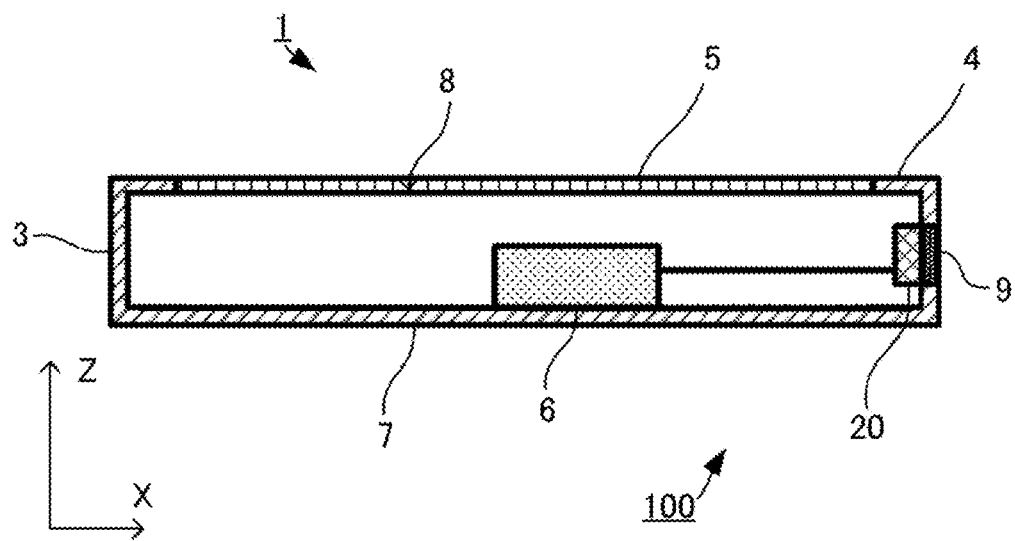
FIG. 1(B) is a sectional view of the electronic device.
Figure 2A:
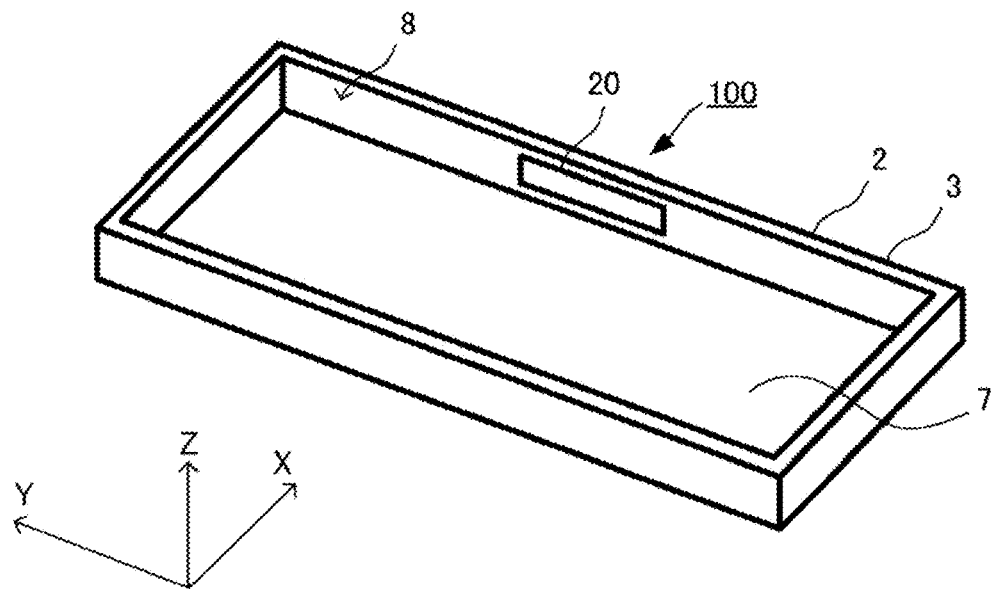
FIG. 2(A) is a diagram for explaining arrangement of a piezoelectric element according to the first embodiment.
Figure 2B:
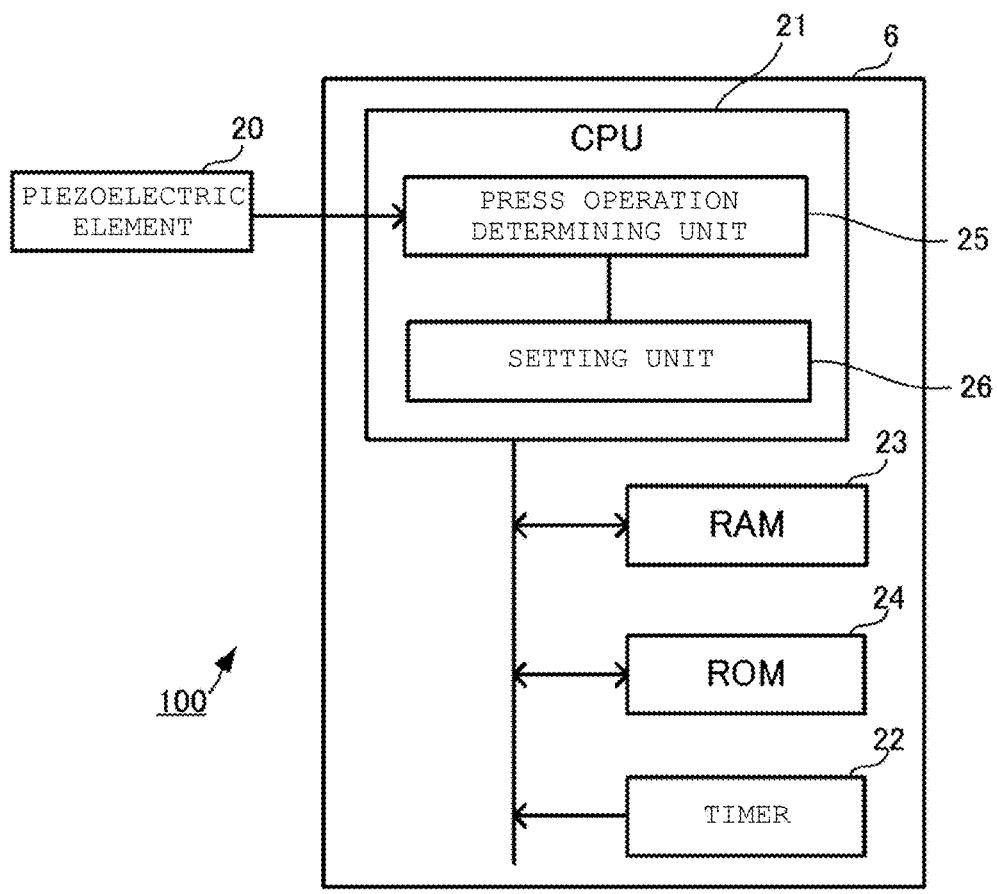
FIG. 2(B) is a block diagram of a pressing sensor.

FIG. 1(A) is a perspective view of an electronic device according to a first embodiment. FIG. 1(B) is a sectional view of the electronic device of FIG. 1(A) that is taken along I-I line. FIG. 2(A) is a diagram for explaining an arrangement of a piezoelectric element according to the first embodiment. FIG. 2(B) is a block diagram of a pressing sensor. In FIG. 2(A), to depict the interior of the electronic device, its top face and part of its internal structure are omitted. The electronic device shown in FIG. 1(A) is an example of the present invention. However, it is noted that the electronic device depicted in FIG. 1(A) can be modified properly in shape or the like according to specifications.

As shown in FIGS. 1(A), 1(B), and 2(A), an electronic device 1 includes a housing 2 of a substantially parallelepiped shape. The housing 2 has a side face 3, a top face 4, a bottom face 7, and an opening 8. The opening 8 is formed on a part of the top face 4. The electronic device 1 includes a tabular display 5 placed in the opening 8 of the housing 2. In one aspect, the electronic device 1 can be configured to have no top face 4. For example, the electronic device 1 may be configured such that the top of the housing 2 is entirely formed as the opening 8 and that the display 5 is disposed in such a way as to close the opening 8.

The display 5 is configured to function as an operation surface on which a user makes a touch operation using a finger, pen, or the like. In the following description, the width direction (i.e., a lateral direction) of the housing 2 is defined as an X direction, the length direction (i.e., vertical direction) of the same as a Y direction, and the thickness direction (i.e., height or vertical direction) of the same as a Z direction.

The housing 2 has a receiving unit 9 disposed on a part of the exterior of the side face 3. The electronic device 1 includes a piezoelectric element 20 disposed on the interior of the side face 3 that corresponds to the receiving unit 9.

The piezoelectric element 20 is pasted or otherwise secured to the interior of the side face 3, using, for example, an adhesive tape, bond, or the like. The piezoelectric element 20 is referred to as a first sensor element according to the present disclosure.

The electronic device 1 includes a circuit 6 disposed inside the housing 2. As shown in FIG. 2(B), the circuit 6 has a CPU 21, a timer 22, a RAM 23, and a ROM 24. The CPU 21 has a press operation determining unit 25 and a setting unit 26 (also referred to as a threshold setting unit).

According to the exemplary aspect, the CPU 21 is configured to read programs (e.g., software code) out of the ROM 24, which is a memory medium to the RAM 23, to carry out and execute various operations described below.

The circuit 6 is electrically connected to the piezoelectric element 20 and is configured to detect a voltage generated by the piezoelectric element 20. The circuit 6, together with the piezoelectric element 20, makes up a pressing sensor 100 according to the exemplary embodiment.

When the receiving unit 9 receives a press operation, the receiving unit 9 is displaced in shape due to the force of the pressing operation. As a result of displacement in shape of the receiving unit 9 and of the housing 2, the piezoelectric element 20 is likewise displaced in shape. The piezoelectric element 20 outputs a voltage corresponding to an amount of displacement in shape of the receiving unit 9. The pressing sensor 100 causes the circuit 6 to detect the voltage that the piezoelectric element 20 generates as a result of its displacement in shape, thereby detects the press.

The press operation determining unit 25 is configured to determine whether the receiving unit 9 is in a state of receiving a press operation, based on a threshold. This will be described in detail later on. After the elapse of a first prescribed time (t1) from a point of time at which the press operation determining unit 25 determines that the receiving unit 9 has received a press operation, the setting unit 26 sets an absolute value of the threshold smaller than an absolute value of the threshold before the elapse of the first prescribed time (t1). It is noted that the piezoelectric element 20 and the circuit 6 do not always need to be placed in the housing 2 and can be placed outside the housing 2 in an alternative aspect. The piezoelectric element 20 will hereinafter be described.

Figure 3A:
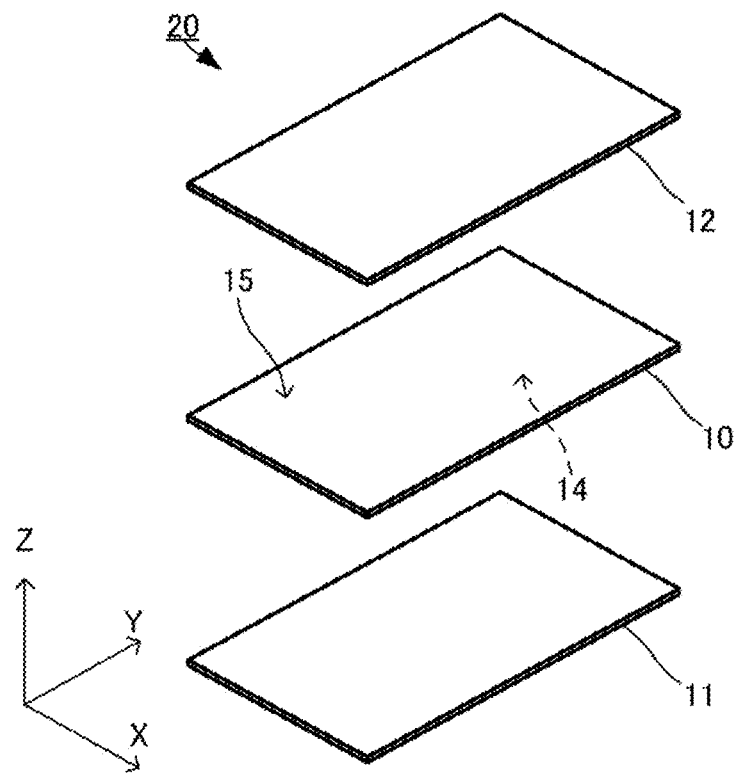
FIG. 3(A) is an exploded perspective view of the piezoelectric element according to the first embodiment.
Figure 3B:
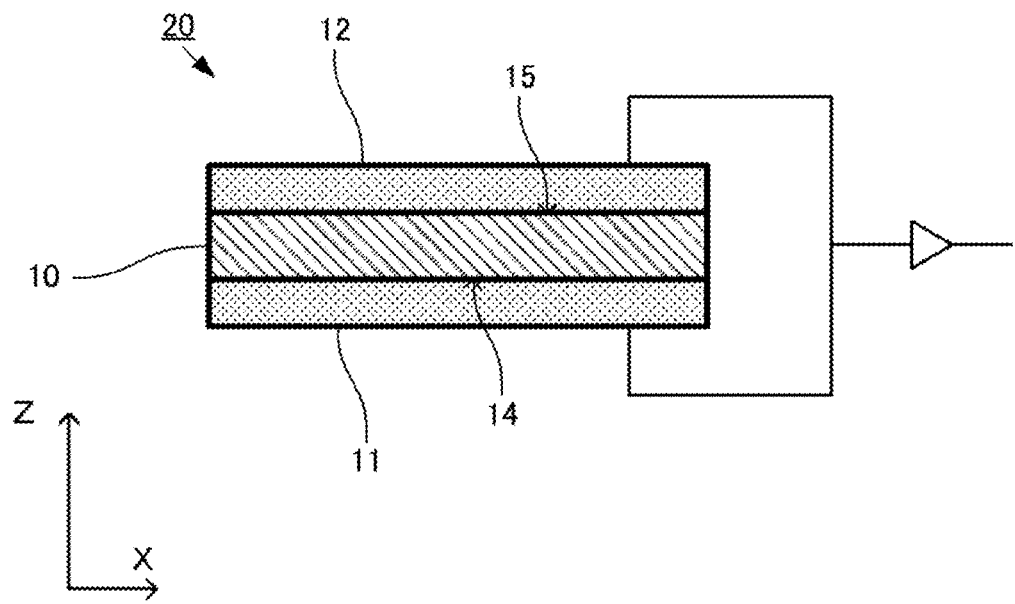
FIG. 3(B) is a sectional view of the piezoelectric element.
Figure 4:
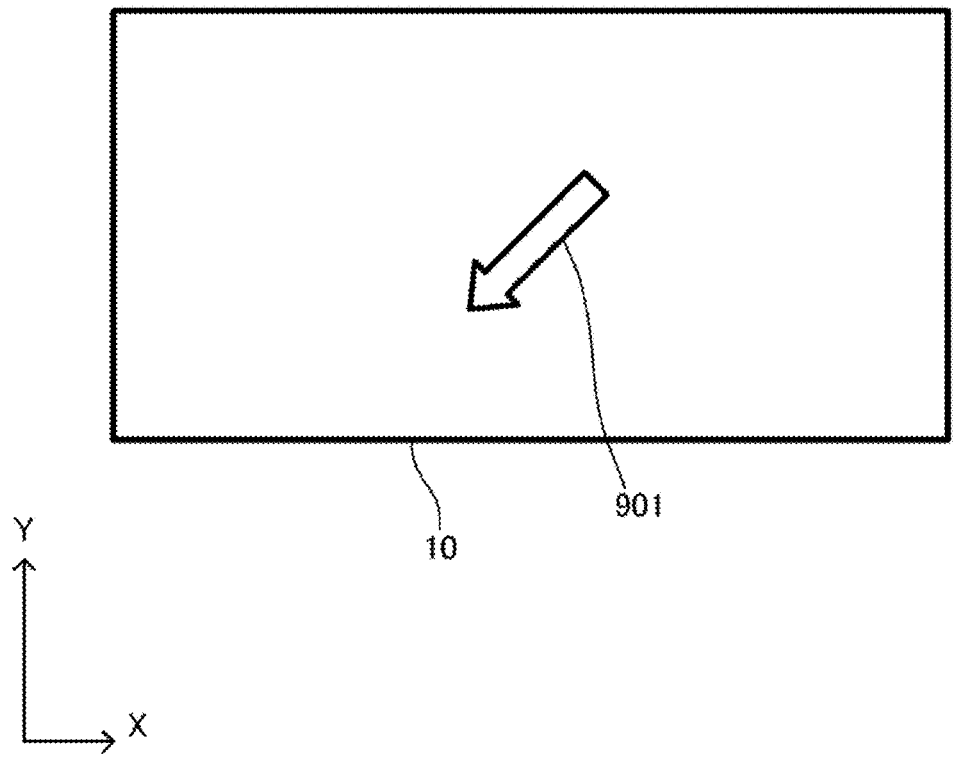
FIG. 4 is an explanatory diagram of a piezoelectric film according to the first embodiment.

FIG. 3(A) is an exploded perspective view of the piezoelectric element according to the first embodiment, and FIG. 3(B) is a sectional view of the piezoelectric element. FIG. 4 is an explanatory diagram of the piezoelectric film according to the first embodiment. As shown in FIGS. 3(A) and 3(B), the piezoelectric element 20 has a piezoelectric film 10 of a flat film, and a first electrode 11 and a second electrode 12 of flat films. It is noted that in FIGS. 3(A) and 3(B), constituent elements other than the piezoelectric film 10, the first electrode 11, and the second electrode 12 are not depicted for clarity purposes.

The piezoelectric film 10 has a first main surface 14 and a second main surface 15. Similar to the piezoelectric film 10, the first electrode 11 and the second electrode 12 are each formed into a rectangular shape in a plan view. The first electrode 11 is disposed on the first main surface 14 of the piezoelectric film 10. The second electrode 12 is disposed on the second main surface 15 of the piezoelectric film 10.

It is preferable that when the piezoelectric element 20 is seen from its top, at least either the first electrode 11 or the second electrode 12 be superposed completely on the piezoelectric film 10 or located inside a plane parallel with the piezoelectric film 10 in a plan view. This arrangement inhibits short circuit at the ends of the first electrode 11 and the second electrode 12. Either the first electrode 11 or the second electrode 12 is a ground electrode according to the exemplary embodiment. The piezoelectric element 20, therefore, outputs a voltage based on a reference voltage at the ground electrode. In the present description, for convenience, the voltage at the ground electrode is assumed to be 0 V.

FIG. 4 is the explanatory diagram of the piezoelectric film according to the first embodiment, showing a plan view of the piezoelectric film. As shown in FIG. 4, the piezoelectric film 10 may be a film made of chiral polymers. According to the first embodiment, the chiral polymers are polylactic acid (PLA) polymers, especially, are poly-L-lactic acid (PLLA) polymers. A PLLA polymer as a chiral polymer has a principle chain of a helical structure. Uniaxially drawing PLLA to orient its molecules gives PLLA piezoelectricity. When the tabular surface of the piezoelectric film 10 is pressed, uniaxially drawn PLLA, i.e., the piezoelectric film 10 generates charges. Charges generated by the piezoelectric film 10 are converted into a voltage through the circuit 6. At this time, the amount of the voltage detected at the circuit 6 depends on the amount of displacement of the tabular surface in a direction perpendicular to the tabular surface, the displacement being caused by the press.

According to the first embodiment, the direction of uniaxial drawing of the piezoelectric film 10 (PLLA) makes an angle of 45 degrees against the Y direction and the Z direction, as indicated by an arrow 901 in FIG. 4. This angle of 45 degrees includes, for example, angles ranging from 45 degrees plus 10 degrees to 45 degrees minus 10 degrees. In this manner, a press to the piezoelectric film 10 causes it to generate a voltage.

Because PLLA becomes piezoelectric when subjected to a molecule orientation process, such as drawing, it does not need to be subjected to a polling process, whereas other polymers or piezoelectric ceramics, such as polyvinylidene difluoride (PVDF), must be subjected to the polling process to make them piezoelectric. The piezoelectricity of PLLA, which does not belong to a ferromagnetic material group, is not developed by ion polarization, which gives such ferromagnetic materials as PVDF and lead zirconate titanate (PZT) piezoelectricity, but originates from the helical structure characteristic of molecules making up PLLA. For this reason, PLLA does not have pyroelectricity than other ferromagnetic piezoelectric materials have. Havin no pyroelectricity, PLLA is not affected by the temperature of the user's finger or frictional heat. This allows the piezoelectric element 20 to be formed as a thin film. While PVDF shows time-dependent fluctuations of its piezoelectric constant, which may drop significantly in some cases, the piezoelectric constant of PLLA is extremely stable, not fluctuating depending on time passage. Thus, without being affected by the surrounding environment, displacement in shape caused by a press can be detected with high sensitivity.

According to the exemplary embodiment, the first electrode 11 and the second electrode 12 formed respectively on both main surfaces of the piezoelectric film 10 can be provided as metal electrodes made of aluminum, copper, or the like. When these electrodes are needed to be transparent, the first electrode 11 and the second electrode 12 may be made of a material with high transparency, such as indium tin oxide (ITO) and poly-3,4-ethylenedioxythiophene (PEDOT). The first electrode 11 and second electrode 12 of the above structure can obtain charges generated by the piezoelectric film 10, as a voltage and output a press detection signal indicative of a voltage value corresponding to a press quantity.

Figure 5:
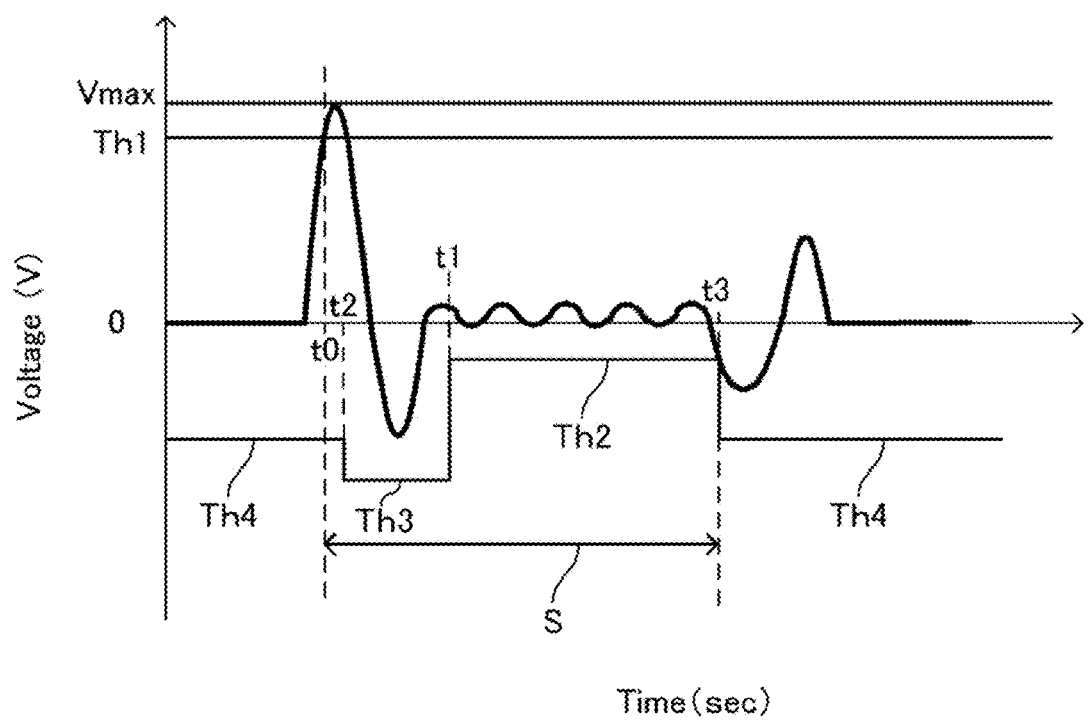
FIG. 5 is a diagram for explaining a relationship between time and a generated voltage in a case where the pressing sensor of the first embodiment is subjected to a long press operation.

FIG. 5 is a diagram for explaining a relationship between time and a generated voltage in a case where the pressing sensor of the first embodiment is subjected to a long press operation.

When the receiving unit 9 receives a press operation, the piezoelectric element 20 outputs a voltage based on the reference voltage (e.g., a ground voltage) at the ground electrode, as indicated in FIG. 5. In the beginning, when displaced in shape by the press operation, the piezoelectric element 20 generates a positive or negative voltage. In this embodiment, a case where the piezoelectric element 20 in this condition generates a positive voltage will be described. When the generated voltage exceeds a first threshold (Th1) on the positive side, the press operation determining unit 25 determines that the receiving unit 9 is in a state of receiving a press operation. For convenience, an elapsed time at this point of determination is defined as a time (t0). A threshold on the negative side in a steady state is defined as a fourth threshold (Th4).

After elapse of the time (t0), the generated voltage peaks at a certain point of time. The voltage at this point of time is defined as Vmax. Afterward, reacting to the press operation, the piezoelectric element 20 makes a restitutive action, and thereby generates a negative voltage. It is preferable that at a second prescribed time (t2) after the time (t0) at which it is determined that the receiving unit 9 has received the press operation, the setting unit 26 switch the current threshold to set a third threshold (Th3) of which the absolute value representing a difference from the ground voltage value is larger than the absolute value of the fourth threshold (Th4). For example, when the voltage generated by the piezoelectric element 20 peaks, the setting unit 26 switches the fourth threshold (Th4) on the negative side to set a new threshold, i.e., the third threshold (Th3) larger than the fourth threshold (Th4) in magnitude on the negative side. This threshold switching prevents the press operation determining unit 25 from erroneously detecting a negative voltage generated as a result of the restitutive action made in reaction to the press operation. The fourth threshold (Th4) may be set in advance as the threshold equal to the third threshold (Th3).

It is also preferable that the setting unit 26 set the third threshold (Th3) in accordance with the maximum Vmax of the voltage output from the piezoelectric element 20. The magnitude of the restitutive action made in reaction to the press operation is roughly proportional to the magnitude of the press operation. For this reason, by setting the third threshold (Th3) with reference to the maximum Vmax of the voltage generated by the press operation, detection of a negative voltage generated as a result of the restitutive action made in reaction to the press operation can be prevented more accurately.

At a point of time at which the first prescribed time (e.g., t1) has passed from the point of time at which the press operation determining unit 25 determines that the receiving unit 9 has received the press operation, that is, a point of time at which a prescribed time has passed from the point of time at which the setting unit 26 sets the third threshold (Th3), the setting unit 26 switches the current threshold to set a second threshold (Th2) smaller in magnitude on the negative side than the third threshold (Th3).

It is preferable that a period during which the setting unit 26 maintains the third threshold (Th3) as the current threshold, that is, a period between the second prescribed time (t2) and the first prescribed time (t1) be set with reference to the maximum Vmax of the voltage generated by the press operation. The length of a period during which the restitutive action made in reaction to the press operation lasts is roughly proportional to the magnitude of the press operation. For this reason, by setting the second prescribed time (t2) and the first prescribed time (t1) with reference to the maximum Vmax of the voltage generated by the press operation, detection of a negative voltage generated as a result of the restitutive action made in reaction to the press operation can be prevented more accurately.

After elapse of the first prescribed time (t1), the setting unit 26 switches the current threshold to set the second threshold (Th2). When the finger is removed slowly from the receiving unit 9 in a long press condition in which little voltage fluctuations result, peaks develop in a relatively broad range, where the peaks are on the same positive side as the peak developing at detection of the press operation is and on the negative side opposite to the positive side, as shown in FIG. 5. Because the absolute value of the second threshold (Th2) is set as a relatively small value, even if a voltage change caused by removal of the finger from the receiving unit 9 is small, the resulting voltage peak is well below the second threshold (Th2) (i.e., in the negative side). The press operation determining unit 25 is thus able to determine that the receiving unit 9 has ended reception of the press operation when the resulting voltage passes the second threshold (Th2). The pressing sensor 100, therefore, can detect a pressing time, which is denoted as S in FIG. 5, in a long press operation. In this case, a point of time at which the press operation has ended is defined as a time (t3).

According to an exemplary aspect, it is preferable that the second threshold (Th2) be of a size that prevents the press operation determining unit 25 from picking noise created by a shift of the finger or the like during the long press to the receiving unit 9. This allows the press operation determining unit 25 to accurately determine the end of the press operation even if the user's hand is shaky a little.

Moreover, it is preferable that when the press operation determining unit 25 determines that the press operation has been ended, the setting unit 26 switch the current threshold from the second threshold (Th2) to the fourth threshold (Th4) for the steady state at a time (t3). This allows smooth detection of a press operation even if the user subsequently carries out a long press operation again.

According to this embodiment, a plurality of the receiving units 9 may be formed and each of them may be disposed in any given location other than the display 5 in the housing 2.

Figure 6:
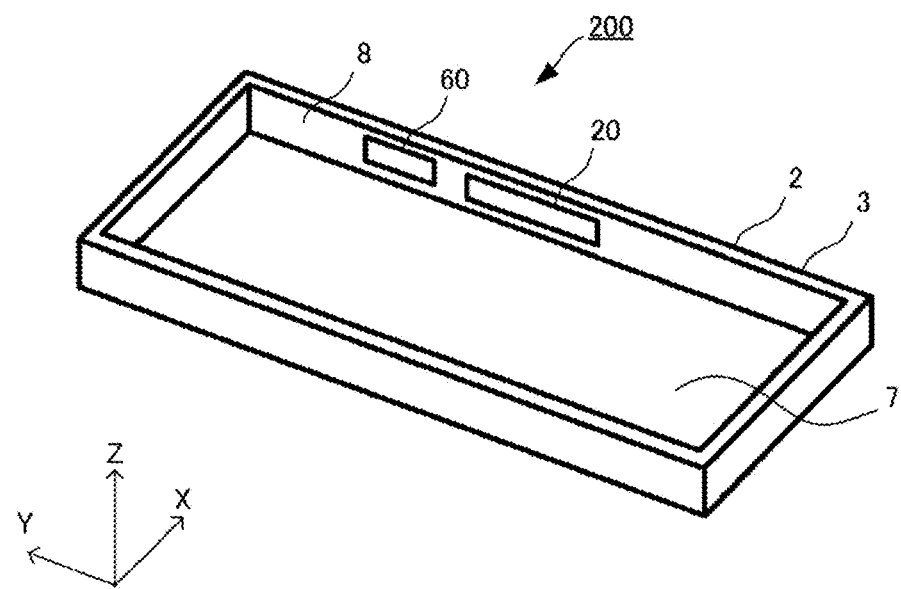
FIG. 6 is a diagram for explaining arrangement of a piezoelectric element according to a second embodiment.
Figure 7:
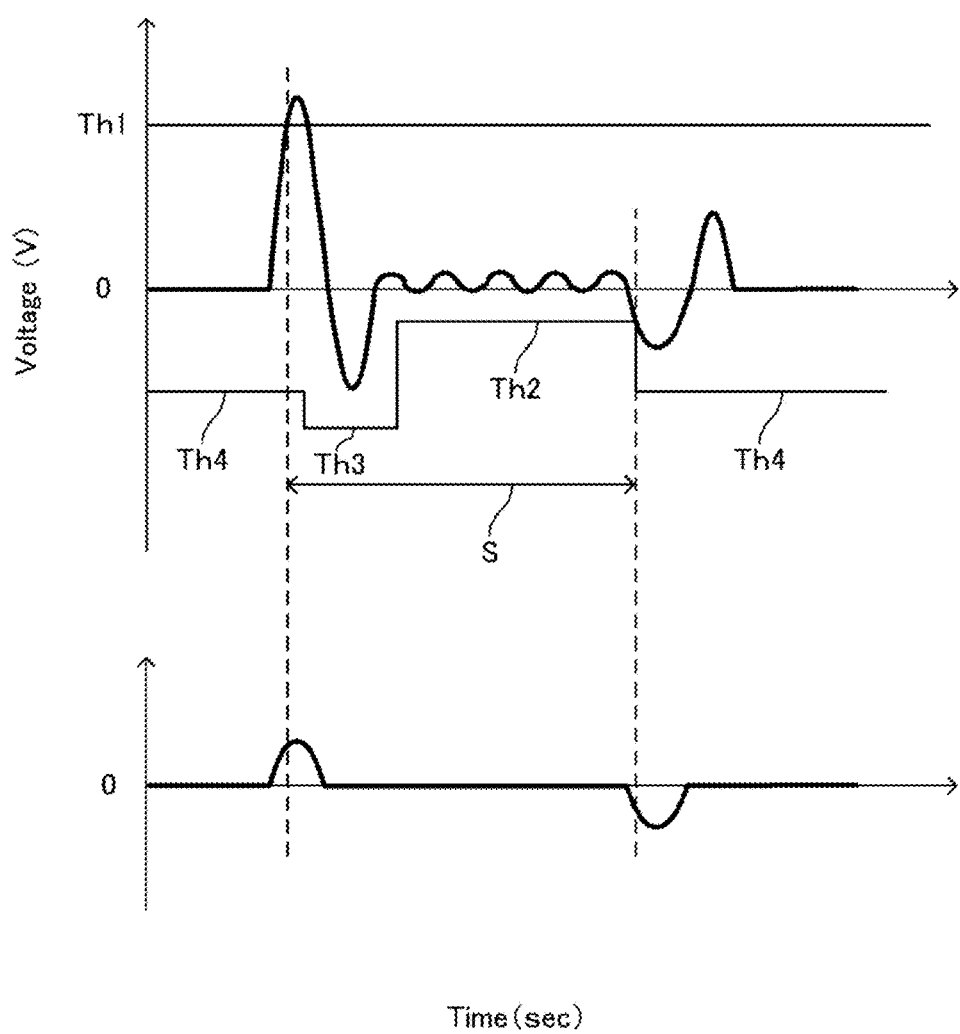
FIG. 7 is a diagram for explaining a relationship between time and a generated voltage in a case where a pressing sensor of the second embodiment is subjected to a long press operation.

FIG. 6 is a diagram for explaining arrangement of a piezoelectric element according to a second embodiment. FIG. 7 is a diagram for explaining a relationship between time and a generated voltage in a case where a pressing sensor of the second embodiment is subjected to a long press operation. The pressing sensor of the second embodiment will hereinafter be described. The same constituent elements as constituent elements included in the pressing sensor 100 of the first embodiment will be omitted in further description for clarity purposes. In FIG. 6, therefore, out of the constituent elements of the pressing sensor of the second embodiment, only the constituent elements different from constituent elements of the pressing sensor 100 are depicted. In FIG. 7, a chart on the lower side shows output from a different sensor element.

As shown in FIG. 6, a pressing sensor 200 of the second embodiment includes a sensor element 60, in addition to the piezoelectric element 20. The sensor element 60 is equivalent to a second sensor element according to the present invention. Similar to the piezoelectric element 20, the sensor element 60 is pasted to the interior of the side face 3, using, for example, an adhesive tape, bond, or the like. The sensor element 60 is a sensor element that is configured to detect its displacement in shape or the like. In other words, the sensor element 60 is an auxiliary sensor element that detects displacement in shape of the piezoelectric element 20 indirectly when the user makes a press to the receiving unit 9. As the sensor element 60, for example, a piezoelectric film sensor, a proximity sensor, an illumination sensor, an acceleration sensor, a gyro sensor, a pressure sensor, or the like can be used.

When the receiving unit 9 of the housing 2 receives a press operation such that a part having received the press operation is near the piezoelectric element 20, the sensor element 60, which receives an effect of the press operation, is configured to generate certain signals. For example, when the sensor element 60 is a pressure sensor, the sensor element 60 is displaced in shape as a result of displacement in shape of the piezoelectric element 20. As shown in a chart on the lower side of FIG. 7, a signal from the sensor element 60 is detected at the start and end of a long press.

The press operation determining unit 25 thus detects not only the output from the piezoelectric element 20, but also signals from the sensor element 60. This allows the setting unit 26 to determine a point of time at which the setting unit 26 switches the threshold based on a signal from the sensor element 60. Thus, the setting unit 26 can set a point of time of switching the threshold more accurately.

If a part other than the receiving unit 9 receives a press operation on the side face 3 of the housing 2, the sensor element 60 generates a signal different from a signal that the sensor element 60 generates when the receiving unit 9 receives a press operation. The press operation determining unit 25 thus determines whether a signal generated by the sensor element 60 is the signal that the sensor element 60 generates when the receiving unit 9 receives a press operation. Through this process, only the case of the receiving unit 9 receiving a press operation can be detected more accurately. When the press operation determining unit 25 determines that the sensor element 60 has generated a signal different from the signal that the sensor element 60 generates when the receiving unit 9 receives a press operation, the setting unit 26 is stopped from switching the threshold. This suppresses unnecessary power consumption.

Figure 8:
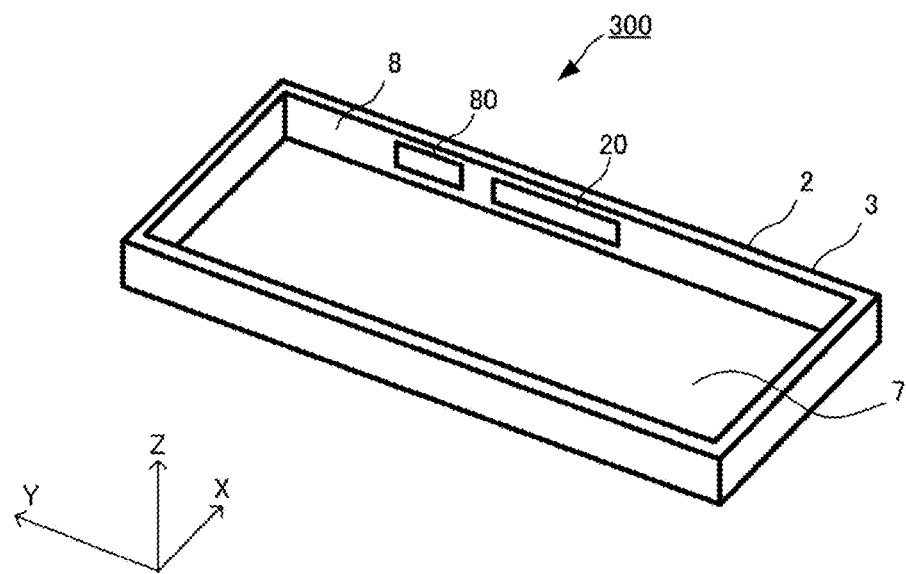
FIG. 8 is a diagram for explaining arrangement of a piezoelectric element according to a third embodiment.
Figure 9:
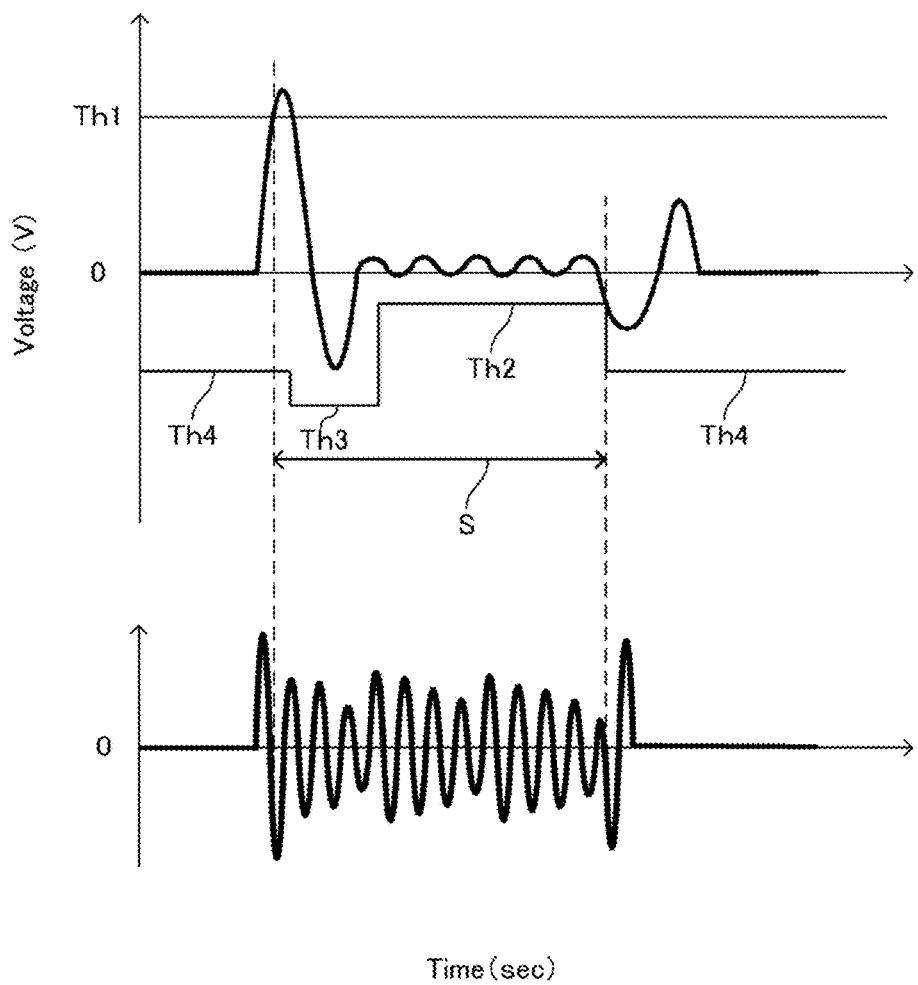
FIG. 9 is a diagram for explaining a relationship between time and a generated voltage in a case where a pressing sensor of the third embodiment is subjected to a long press operation.

FIG. 8 is a diagram for explaining arrangement of a piezoelectric element according to a third embodiment. FIG. 9 is a diagram for explaining a relationship between time and a generated voltage in a case where a pressing sensor of the third embodiment is subjected to a long press operation. The pressing sensor of the third embodiment will hereinafter be described. The same constituent elements as constituent elements included in the pressing sensor 200 of the second embodiment will be omitted in further description for clarity purposes. In FIG. 8, therefore, out of the constituent elements of the pressing sensor of the third embodiment, only the constituent elements different from constituent elements of the pressing sensor 200 are depicted. In FIG. 9, a chart on the lower side shows output from a different sensor element.

As shown in FIG. 8, a pressing sensor 300 of the third embodiment includes a sensor element 80 in place of the sensor element 60. The sensor element 80 is equivalent to a third sensor element according to the present invention. The sensor element 80 is a sensor element that detects minute tremors of a living body (so-called living body's tremors) to obtain tremor information.

When the user makes a press to the receiving unit 9, the sensor element 80 detects living body's tremors that are transmitted through the housing 2 to the sensor element 80. For example, as shown in FIG. 9, in a period in which the user's finger is in contact with the housing 2, the sensor element 80 keeps outputting a signal. Based on detected living body's tremors, the press operation determining unit 25 determines whether the signal output from the sensor element 80 is a signal that the sensor element 80 generates when the receiving unit 9 receives a press operation. Through this process, only the case of the receiving unit 9 receiving a press operation can be detected more accurately.

The size of the signal changes depending on the distance of a part having received the press operation to the sensor element 80 on the side face 3 of the housing 2. For this reason, whether the receiving unit 9 has been subjected to the press operation can be determined based on a positional relationship between the sensor element 80 and the piezoelectric element 20. Based on the magnitude of detected living body's tremors, therefore, the receiving unit 9 having been subjected to the press operation can be detected more clearly.

Figure 10A:
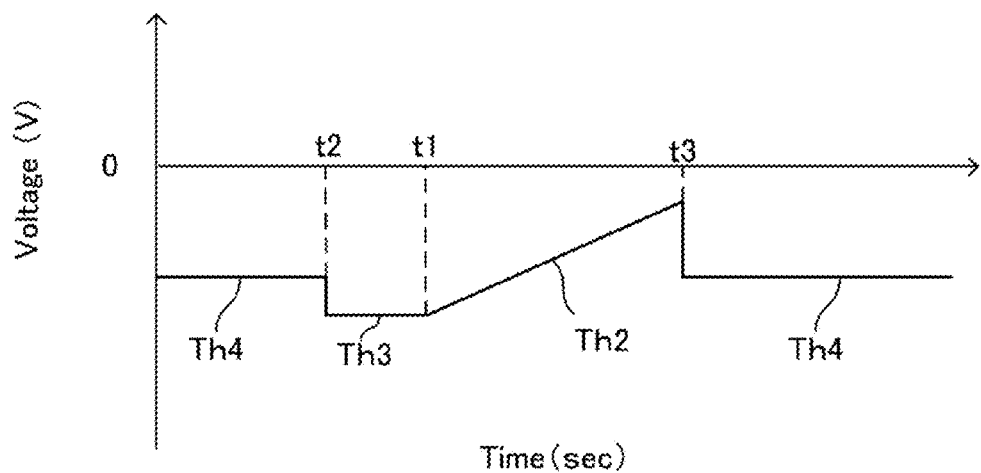
FIGS. 10(A) to 10(C) are explanatory diagrams of modifications.
Figure 10B:
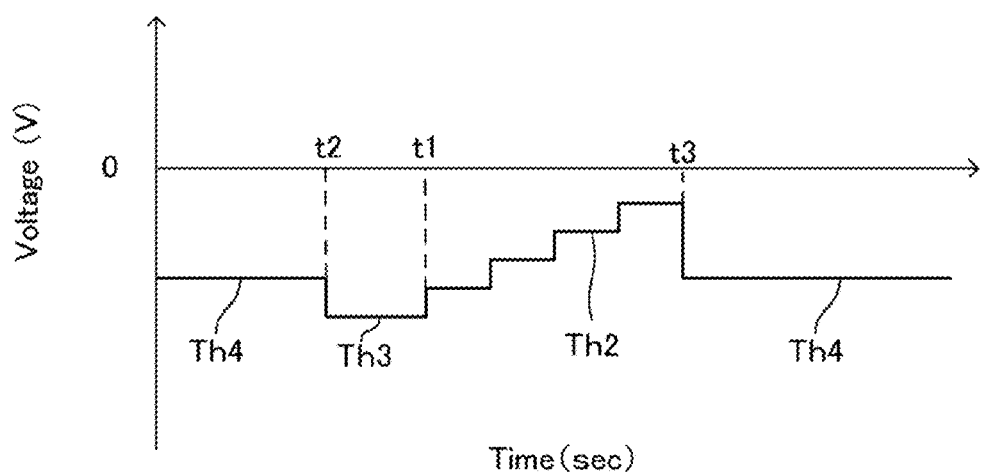
Figure 10C:
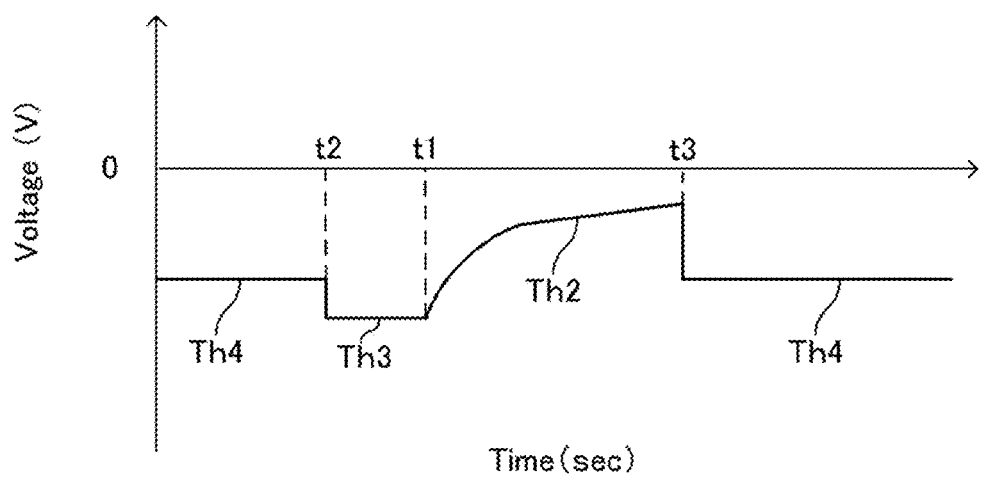
Figure 11A:
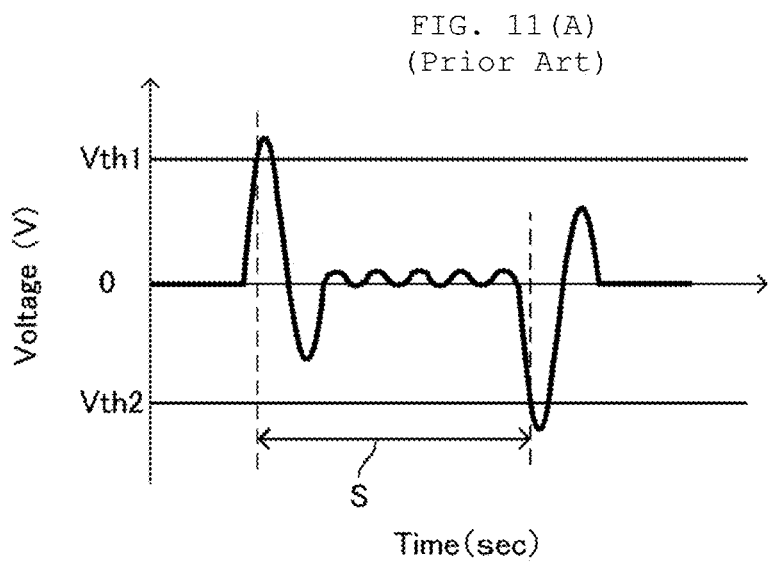
FIGS. 11(A) to 11(C) are diagrams for explaining fluctuations of a voltage that is generated when a conventional pressing sensor is subjected to a long press operation.
Figure 11B:
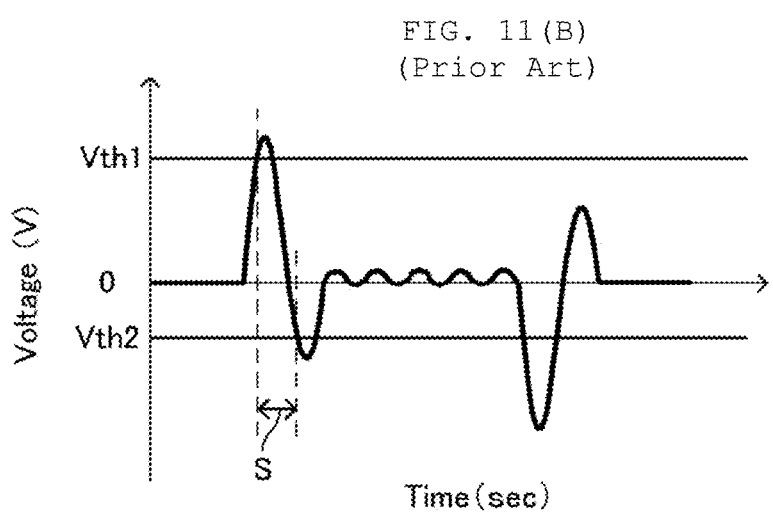
Figure 11C:
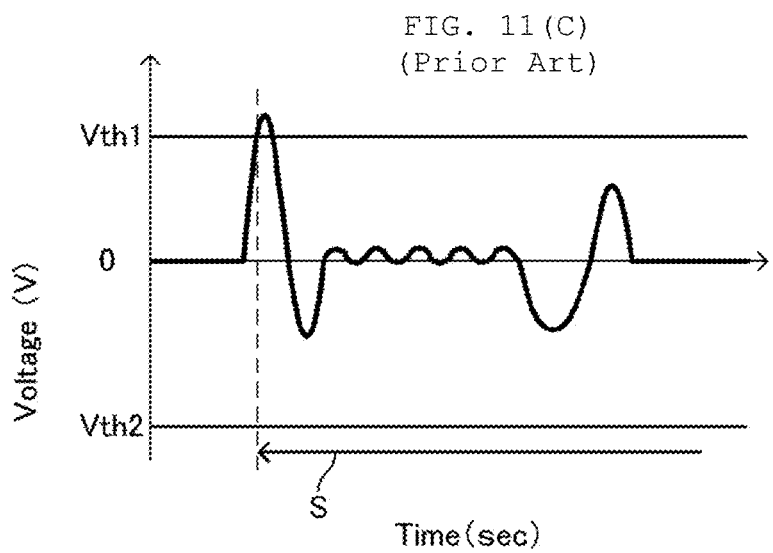

FIG. 10(A) is an explanatory diagram of a first modification, FIG. 10(B) is an explanatory diagram of a second modification, and FIG. 10(C) is an explanatory diagram of a third modification of the exemplary embodiments. The first to third modifications are different from the first embodiment only in that their second thresholds (Th2) on the negative side are each different from the second threshold (Th2) of the pressing sensor 100 of the first embodiment. These second thresholds (Th2), therefore, will be described and other constituent elements will not be described for clarity purposes.

In the pressing sensor 100 of the first embodiment, the second threshold (Th2) remains constant for a given period. In contrast, the second threshold (Th2) of the first modification increases in proportional to a time elapsed during a given period (t1 to t3), as shown in FIG. 10(A). The second threshold (Th2) of the second modification increases step by step during the given period (t1 to t3), as shown in FIG. 10(B). The second threshold (Th2) of the third modification increases in a curved pattern during the given period (t1 to t3), as shown in FIG. 10(C). In this manner, the second threshold (Th2) can be changed into various patterns of threshold with respect to a time elapsed. The second threshold (Th2), therefore, can be set properly in accordance with the shape, hardness, or the like of the housing 2. By increasing the second threshold (Th2) in proportional to a time elapsed in such a manner as depicted in FIGS. 10(A) to 10(C), erroneous detection caused by the effects of unnecessary noise can be further reduced.

It is noted that the structures according to the above exemplary embodiments can be applied not only to a smart phone, for example, but also to various electronic devices. According to the above embodiments, providing the housing with an opening, which is necessary in the case of a mechanical switch, is unnecessary. The electronic device of the above embodiments is thus used preferably as a device required to be waterproofing, such as a switch set in a washing machine or a bathroom.

Moreover, it is noted that the above exemplary embodiments have been described exemplarily in their all aspects and that the embodiments do not pose any limitation. The scope of the present invention will be clarified not by the above embodiment but by claims. The scope of the present invention includes what is claimed by claims.

DESCRIPTION OF REFERENCE SYMBOLS

1: electronic device
9: receiving unit
10: piezoelectric film
20: piezoelectric element (first sensor element)
25: press operation determining unit
26: setting unit
60: piezoelectric element (second sensor element)
80: piezoelectric element (third sensor element)
100, 200, 300: pressing sensor

The invention claimed is:

1. A pressing sensor comprising:
  a first sensor element configured to output a voltage corresponding to a displacement in shape of a receiving unit that receives a press operation;
  a press operation determining unit configured to determine whether the receiving unit is in a state of receiving the press operation; and
  a threshold setting unit configured to set, after a first prescribed time from when the press operation determining unit determines that the receiving unit has received the press operation, an absolute value of a threshold that is smaller than an absolute value of the threshold before elapse of the first prescribed time,
  wherein the absolute value of the threshold represents a difference from a reference voltage value, such that the press operation determining unit is further configured to determine that the press operation has ended when the voltage output from the first sensor element passes the absolute value of the threshold,
  wherein a first threshold is a threshold for determining whether the receiving unit is in the state of receiving the press operation,
  wherein a second threshold is a threshold for determining whether the press operation has ended, and
  wherein the threshold setting unit is further configured to set, after the press operation determining unit determines that the receiving unit has received the press operation, a third threshold in a period between a second prescribed time preceding the first prescribed time and the first prescribed time, with third threshold having an absolute value representing a difference from the reference voltage value that is larger than an absolute value of the second threshold.

2. The pressing sensor according to claim 1, wherein the first sensor element comprises a piezoelectric element with a piezoelectric film and first and second electrodes disposed on opposing sides thereof.

3. The pressing sensor according to claim 2, wherein the reference voltage value is a ground voltage of the piezoelectric element.

4. The pressing sensor according to claim 1, wherein the threshold setting unit is further configured to set the first prescribed time and the second prescribed time in accordance with a maximum of a voltage that is output from the first sensor element in a period between when the press operation determining unit determines that the receiving unit has received the press operation and the second prescribed time.

5. The pressing sensor according to claim 4, wherein the threshold setting unit is further configured to set the third threshold in accordance with a maximum of a voltage that is output from the first sensor element in a period between when the press operation determining unit determines that the receiving unit has received the press operation and the second prescribed time.

6. The pressing sensor according to claim 1, wherein, when the press operation determining unit determines that the press operation has ended, the threshold setting unit is configured to switch the second threshold to a fourth threshold for a steady-state.

7. The pressing sensor according to claim 1, further comprising:
a second sensor element,
wherein the press operation determining unit is further configured to determine whether the second sensor element has a detected displacement in shape.

8. The pressing sensor according to claim 7, further comprising:
a third sensor element,
wherein the press operation determining unit is configured to determine whether the third sensor element has detected a living body's tremors to obtain tremor information.

9. The pressing sensor according to claim 1, wherein the threshold setting unit is further configured to set a length of the period of the third threshold to be proportional to a magnitude of the press operation.

10. A pressing sensor comprising:
a sensor element configured to output a voltage corresponding to a displacement of a receiving unit that receives a press operation;
a press operation determining unit configured to determine when the receiving unit is in a state of receiving the press operation when the outputted voltage from the sensor element is above a press detection voltage threshold; and
a threshold setting unit configured to increase, after a first prescribed time from when the press operation determining unit determines that the receiving unit has received the press operation, an absolute value of the press detection voltage threshold to prevent erroneous detection that the press operation has ended based on a voltage generated by a restitutive action of the sensor element,
wherein the press operation determining unit is further configured to determine that the press operation has ended when the voltage output from the sensor element passes the absolute value of the press detection voltage threshold, which represents a difference from a reference voltage value,
wherein a first threshold is the press detection voltage threshold that determines whether the receiving unit is in the state of receiving the press operation,
wherein a second threshold is a threshold for determining whether the press operation has ended, and
wherein the threshold setting unit is further configured to set, after the press operation determining unit determines that the receiving unit has received the press operation, a third threshold in a period between a second prescribed time preceding the first prescribed time and the first prescribed time, with third threshold having an absolute value representing a difference from the reference voltage value that is larger than an absolute value of the second threshold.

11. The pressing sensor according to claim 10, wherein the threshold setting unit is further configured to reduce the press detection voltage threshold after the restitutive action of the sensor element to be smaller than the absolute value of the press detection voltage threshold to prevent erroneous detection that the press operation has ended.

12. The pressing sensor according to claim 10, wherein the sensor element comprises a piezoelectric element with a piezoelectric film and first and second electrodes disposed on opposing sides thereof.

13. A method for detecting a press operation, the method comprising:
outputting, by a first sensor element, a voltage corresponding to a displacement in shape of a receiving unit that receives a press operation;
determining, by a press operation determining unit, whether the receiving unit is in a state of receiving the press operation; and
setting, by a threshold setting unit, after a first prescribed time from when the press operation determining unit determines that the receiving unit has received the press operation, an absolute value of a threshold that is smaller than an absolute value of the threshold before elapse of the first prescribed time,
wherein the absolute value of the threshold represents a difference from a reference voltage value, such that the press operation determining unit is further configured to determine that the press operation has ended when the voltage output from the first sensor element passes the absolute value of the threshold,
wherein a first threshold is a threshold for determining whether the receiving unit is in the state of receiving the press operation, and a second threshold is a threshold for determining whether the press operation has ended, and
wherein the method further comprise setting, by the threshold setting unit and after the press operation determining unit determines that the receiving unit has received the press operation, a third threshold in a period between a second prescribed time preceding the first prescribed time and the first prescribed time, with third threshold having an absolute value representing a difference from the reference voltage value that is larger than an absolute value of the second threshold.

14. The method according to claim 13, further comprising setting, by the threshold setting unit, the first prescribed time and the second prescribed time in accordance with a maximum of a voltage that is output from the first sensor element in a period between when the press operation determining unit determines that the receiving unit has received the press operation and the second prescribed time.

15. The method according to claim 14, further comprising setting, by the threshold setting unit, the third threshold in accordance with a maximum of a voltage that is output from the first sensor element in a period between when the press operation determining unit determines that the receiving unit has received the press operation and the second prescribed time.

16. The method according to claim 13, further comprising switching, by the threshold setting unit, the second threshold to a fourth threshold for a steady-state when the press operation determining unit determines that the press operation has ended.

* * * * *